(12) United States Patent
Kim et al.

(10) Patent No.: US 11,631,725 B2
(45) Date of Patent: Apr. 18, 2023

(54) ORGANIC LIGHT EMITTING DISPLAY DEVICE

(71) Applicant: LG Display Co., Ltd., Seoul (KR)

(72) Inventors: Dojoong Kim, Paju-si (KR); Daeil Kang, Paju-si (KR); Soojin Kim, Paju-si (KR); Samjong Lee, Paju-si (KR); Saehoon Oh, Paju-si (KR); Hyungi Hong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 196 days.

(21) Appl. No.: 16/688,571

(22) Filed: Nov. 19, 2019

(65) Prior Publication Data

US 2020/0185475 A1 Jun. 11, 2020

(30) Foreign Application Priority Data

Dec. 7, 2018 (KR) .................. 10-2018-0157033

(51) Int. Cl.
*H01L 27/32* (2006.01)

(52) U.S. Cl.
CPC ...... *H01L 27/3248* (2013.01); *H01L 27/3246* (2013.01); *H01L 27/3272* (2013.01); *H01L 27/3276* (2013.01)

(58) Field of Classification Search
CPC ............. H01L 27/3248; H01L 27/3246; H01L 27/326; H01L 27/3211; H01L 27/3218; H01L 27/3295; H01L 27/3283; H01L 51/0004; H01L 51/0005
See application file for complete search history.

(56) References Cited

U.S. PATENT DOCUMENTS

| 2003/0140982 | A1* | 7/2003 | Seki ........................ H05B 33/12 141/1 |
| 2006/0145143 | A1* | 7/2006 | Sorich .................... H01L 27/307 257/40 |
| 2014/0197396 | A1* | 7/2014 | Madigan ............. H01L 27/3246 257/40 |
| 2016/0240596 | A1* | 8/2016 | Yoshida .............. H01L 51/0005 |
| 2017/0069697 | A1* | 3/2017 | Hashimoto ......... H01L 27/3246 |

* cited by examiner

*Primary Examiner* — Monica D Harrison
*Assistant Examiner* — John Lin
(74) *Attorney, Agent, or Firm* — Fenwick & West LLP

(57) ABSTRACT

The present disclosure provided an organic light-emitting display device comprising: a substrate where a first direction and a second direction intersecting each other are defined, the substrate on which sub-pixels arranged along the first direction and the second direction; first electrodes of organic light-emitting diodes allocated respectively to the sub-pixels; a first bank having first openings exposing the first electrodes; and a second bank having second openings exposing the first electrode on the first bank, wherein in at least one region, the second opening simultaneously exposes at least two first electrodes neighboring in the third direction.

14 Claims, 19 Drawing Sheets

ORGANIC LIGHT EMITTING DISPLAY DEVICE

CROSS-REFERENCE TO RELATED APPLICATIONS

This application claims the priority benefit of Republic of Korea Patent Application No. 10-2018-0157033 filed on Dec. 7, 2018, which is incorporated by reference in its entirety.

BACKGROUND

Field of Technology

The present disclosure relates to an organic light-emitting display device.

Related Art

Recently, various display devices that are less bulky and more lightweight than cathode ray tubes (CRTs) are being developed. Examples of these display devices include liquid crystal displays (LCDs), plasma display panels (PDPs), field emission displays (FEDs), organic light-emitting display devices, etc.

The organic light-emitting display devices are self-luminous devices, and offer several advantages such as fast response time, high light emission efficiency, high brightness, and wide viewing angle. Moreover, the organic light-emitting display devices may be implemented as a flexible display device because they can be fabricated on a flexible substrate such as plastic.

In keeping with the recent trend towards large-area, high-resolution organic light-emitting display devices, a single panel comprises a plurality of sub-pixels. Generally, masks are used to pattern red (R), green (G), and blue (B) sub-pixels. Thus, a large-area, high-resolution display device requires a corresponding large-area fine metal mask (FMM). The larger the area of the mask, the more it will sag, which leads to various defects such as displacement of organic light-emitting materials constituting an emission layer.

A way to solve the problems of the aforementioned method of deposition using a mask, a solution process is getting attention because it is simple to implement and has advantages in large-area display devices. The solution process enables large-area patterning through inkjet printing or nozzle printing, without using a mask, and has a material use rate of 50 to 80%, which is very high compared to vacuum deposition which has a material use rate no higher than 10%. Also, the solution process offers good thermal stability and morphological properties because it provides a higher glass transition temperature than vacuum-deposited thin films.

However, when an emission layer is formed through the solution process, a thickness deviation in sub-pixels causes thickness non-uniformity to considerably deteriorate display quality

SUMMARY

An aspect of the present disclosure is to provide an organic light-emitting display device that has double bank structures.

An exemplary embodiment of the present disclosure provides an organic light-emitting display device comprising: a substrate where a first direction and a second direction which intersect at a right angle are defined, that have sub-pixels arranged along the first direction and the second direction; first electrodes of organic light-emitting diodes allocated respectively to the sub-pixels; a first bank having first openings exposing the first electrodes; and a second bank on the first bank, that has second openings exposing the first electrodes, wherein, in at least one region, the second openings expose at least two first electrodes neighboring in a third direction, and the angle between the third direction and the first direction and the angle between the third direction and the second direction are tilted angles.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
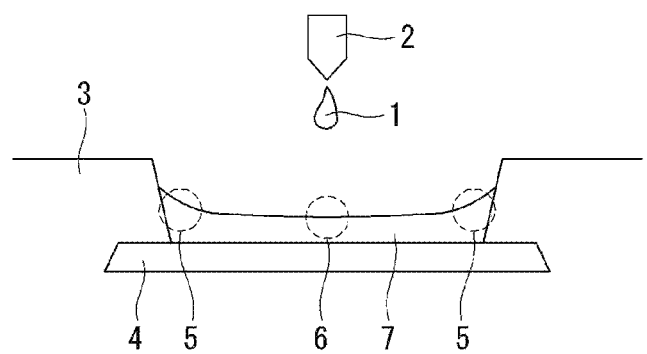
FIG. 1 is a view for explaining the problems of a solution process.

Hereinafter, exemplary embodiments of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure. In describing various exemplary embodiments, descriptions of the same or like components will be given in the beginning but omitted in other exemplary embodiments.

Although terms including ordinal numbers such as "first" and "second" may be used to describe various components, the components are not limited by the terms. The terms are used only to distinguish one component from other components.

FIG. 1 is a view for explaining the problems of a solution process.

Referring to FIG. 1, forming an organic light-emitting layer using a solution process (or, soluble process) has the problem of deteriorating the light emission characteristics of organic light-emitting display devices due to pileup. More specifically, an organic light-emitting material 1 is deposited onto a first electrode 4 divided by a bank 3 by inkjet equipment 2 or the like. The deposited organic light-emitting material 1 has varying thicknesses depending on the position, due to differences in a hardening rate in the hardening process. That is, a non-uniform organic light-emitting layer 7 is formed which is thick at the edge 5 adjoining the bank and thin at the center 6.

The formation of the non-uniform organic light-emitting layer 7 can cause the problem of deterioration in display quality because brightness varies with position. In addition, the lifetime of the device can degrade due to differences in current density within the organic light-emitting layer 7, or the process yield can be lowered due to formation of dark spots. In view of this, there is a need to reduce the pile-up area as much as possible when forming the emission layer by using the solution process.

First Exemplary Embodiment

Figure 2:
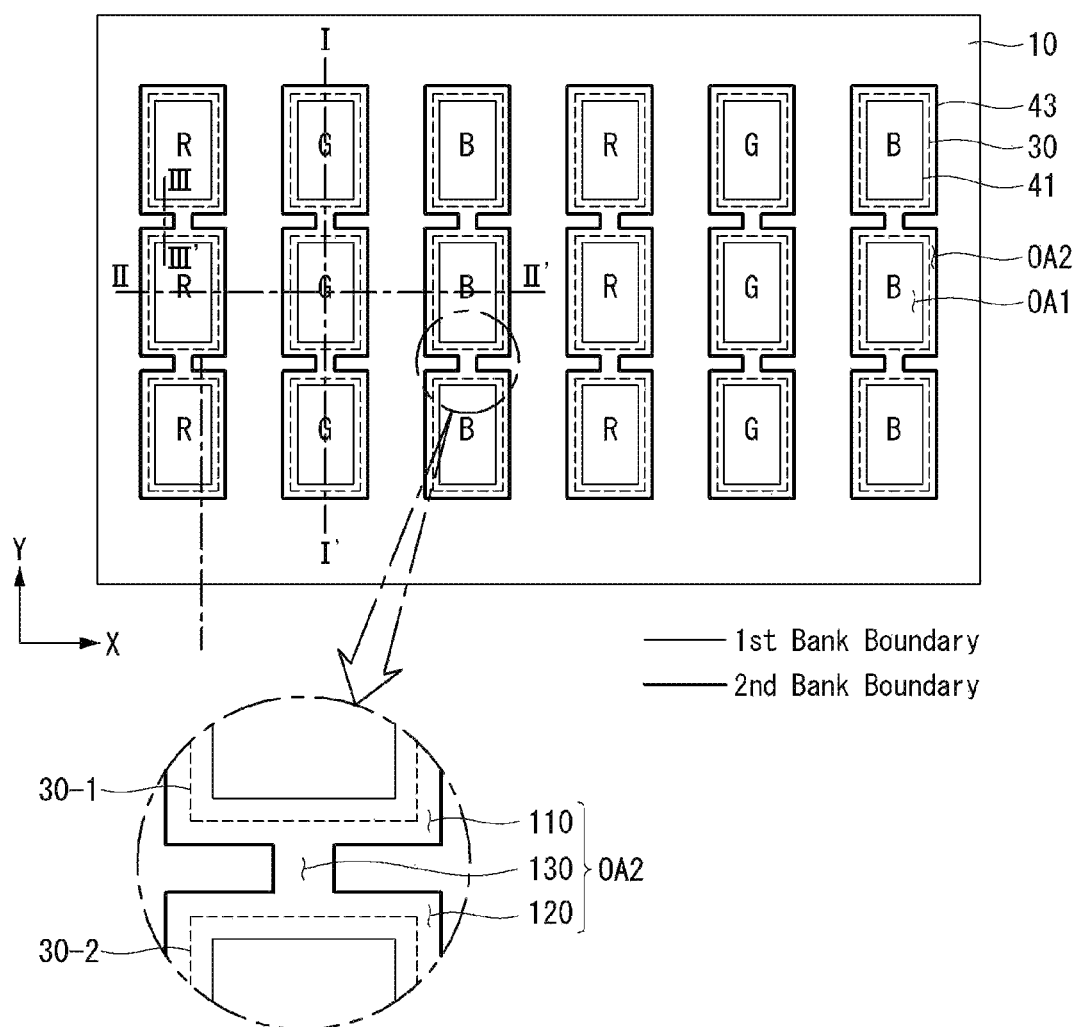
FIG. 2 is a schematic plan view of an organic light-emitting display device according to a first exemplary embodiment of the present disclosure.
Figure 3:
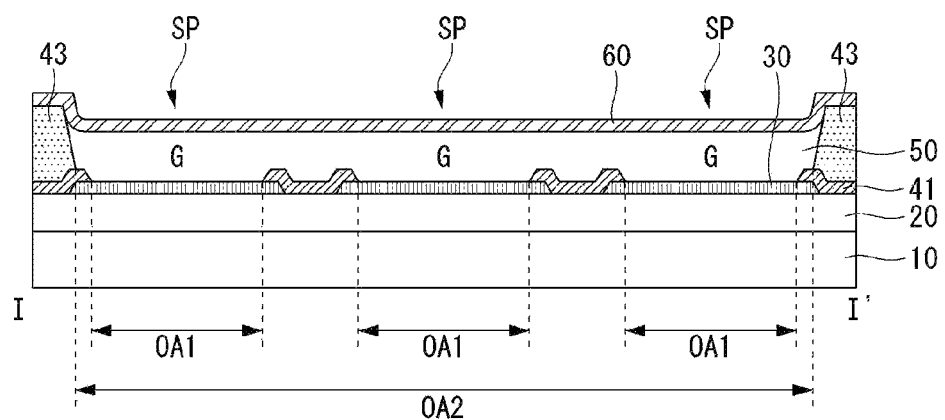
FIG. 3 is a cross-sectional view taken along the line I-I' in FIG. 2 according to one embodiment of the present disclosure.
Figure 4:
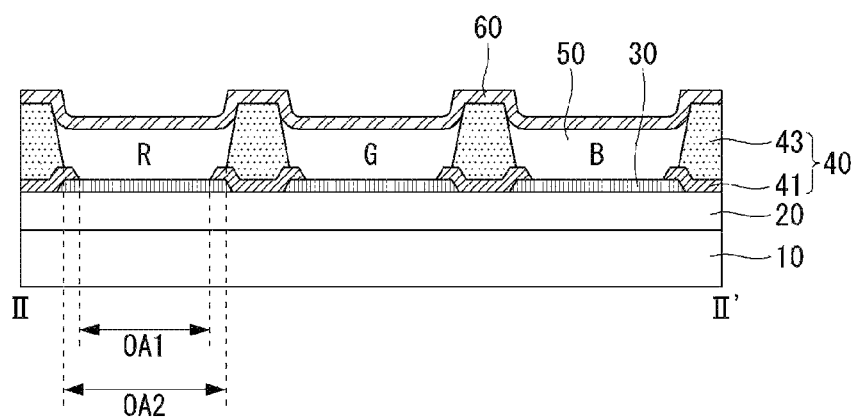
FIG. 4 is a cross-sectional view taken along the line II-II' in FIG. 2 according to one embodiment of the present disclosure.
Figure 5:
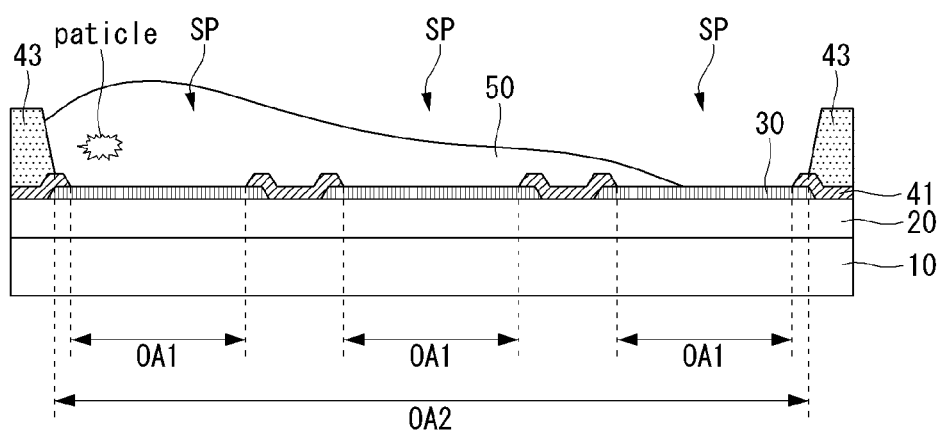
FIG. 5 is a view for explaining problems occurring when particles are left behind.

FIG. 2 is a schematic plan view of an organic light-emitting display device according to a first exemplary embodiment of the present disclosure. FIG. 3 is a cross-sectional view taken along the line I-I' in FIG. 2. FIG. 4 is a cross-sectional view taken along the line II-II' in FIG. 2. FIG. 5 is a view for explaining problems occurring when particles are left behind.

Referring to FIGS. 2 to 4, the organic light-emitting display device according to the first exemplary embodiment comprises a substrate 10 where sub-pixels SP are arranged. The substrate 10 may have various planar shapes, for example, all planar shapes such as square, circular, and elliptical, as well as the rectangular shape shown in the drawings. A first direction (for example, X direction) and a second direction (for example, Y direction), which intersect at a right angle, are defined on the substrate 10, regardless of the planar shape of the substrate 10. The positions and arrangements of sub-pixels and/or openings to be described later may be defined by the first and second axes.

A circuit element layer 20 and organic light-emitting diodes, which are driven by the elements provided in the circuit element layer 20, are placed on the substrate 10.

Signal lines and electrodes for applying driving signals to the organic light-emitting diodes may be arranged on the circuit element layer 20, and the signal lines and the electrodes may be placed separately with at least one insulating layer between them if necessary. If the organic light-emitting display device is an active matrix (AM) display, the circuit element layer 20 may further comprise a transistor allocated per sub-pixel SP.

Each organic light-emitting diode comprises a first electrode 30, a second electrode 60, and an organic light-emitting layer 50 interposed between the first electrode 30 and the second electrode 60. The first electrode 30 may be an anode, and the second electrode 60 may be a cathode. The second electrode 60 may contain a bend portion. For example, the second electrode 60 may contain a bent portion at the edge of each sub-pixel, as illustrated in FIG. 4.

More specifically, the sub-pixels SP may be arranged along the first direction (e.g., X direction) and second direction (e.g., Y direction) which intersect each other. The sub-pixels SP arranged neighboring along the first direction may emit light of different colors, and the sub-pixels SP arranged neighboring along the second direction may emit light of the same color. The first electrodes 30 of the organic light-emitting diodes are placed on the sub-pixels SP. One first electrode 30 may be allocated per sub-pixel SP.

A bank 40 is placed on the first electrodes 30. The bank 40 comprises a first bank 41 and a second bank 43.

The first bank 41 is located on the first electrodes 30. The first bank 41 comprises first openings OA1 exposing at least part of the first electrodes 30. Each first opening OA1 exposes one first electrode 30. Thus, the number of first openings OA1 and the number of first electrodes 30 may be equal.

The first bank 41 may be made relatively thin so as to be covered by the organic light-emitting layer 50. The first bank 41 may be hydrophilic. In an example, the first bank 41 may be formed of a hydrophilic, inorganic insulating material such as silicon oxide ($SiO_2$) or silicon nitride ($SiNx$).

Although the drawings illustrate that the first openings OA1 are approximately rectangular, they are not limited to this shape. Also, the drawings illustrate that all of the first openings OA1 have the same shape and area, but they are not limited to this and at least one first opening OA1 may have a different shape and/or area from another first opening OA1. For example, the shape and/or area of the first openings OA1 may be properly selected in view of the lifetime of organic light-emitting materials for forming the organic light-emitting layer 50 of the organic light-emitting diodes. Parts of the first electrodes 30 exposed by the first openings OA1 may be defined as emission regions.

The second bank 43 is placed on the substrate 10 where the first bank 41 is formed. The second bank 43 comprises second openings OA2 exposing at least part of the first electrodes 30. A plurality of second openings OA2 are arranged in parallel in the first direction, and extend in the second direction. The second openings OA2 extend in the second direction and expose a plurality of first electrodes 30 arranged along the second direction. Alternatively, the second openings OA2 extend in the second direction and expose a plurality of first openings OA1 arranged along the second direction.

The second bank 43 may be hydrophobic. In an example, the second bank 43 may be formed with a hydrophobic material coated on an insulating material or formed with an insulating material containing a hydrophobic material. The second bank 43 may be made of organic material. The hydrophobic nature of the second bank 43 may allow the organic light-emitting material constituting the organic light-emitting layer 50 to be coated with a relatively uniform thickness. Also, the second bank 43 may function as a barrier that encloses the organic light-emitting material dropped into a corresponding region, so as to prevent organic light-emitting materials of different colors from being mixed together.

Although the drawings illustrate that the second openings OA2 are approximately rectangular, they are not limited to this shape. Also, the drawings illustrate that all of the second openings OA2 have the same shape and area, but they are not limited to this and at least one second opening OA2 may have a different shape and/or area from another second opening OA2. For example, the shape and/or area of the second openings OA2 may be properly selected in view of the lifetime of organic light-emitting materials.

The second openings OA2 are located on the outside of the first openings OA1, at a distance from the first openings A1. That is, the boundary of the first bank 41 is spaced a preset distance apart from the boundary of the second bank 43. Therefore, the first openings OA1 may be exposed by the second openings OA2.

The organic light-emitting layer 50 is placed on the substrate 10 where the second bank 43 is formed. The organic light-emitting layer 50 may be formed within the corresponding second openings OA2, in the direction in which the second openings OA2 extend. That is, the organic light-emitting material deposited into one second opening OA2 covers the first electrodes 30 and first bank 41 exposed by the second opening OA2, and are not physically separated by the first bank 41.

Organic light-emitting material of the same color is deposited on a plurality of first electrodes 30 exposed by one second opening OA2. This means that a plurality of sub-pixels SP allocated to positions corresponding to one second opening OA2 emit light of the same color. The planar shape of the organic light-emitting layer 50 may correspond to the planar shape of the second openings OA2.

Organic light-emitting materials of different colors may be sequentially and alternately deposited in their corresponding second openings OA2. The organic light-emitting materials of different colors may comprise organic light-emitting materials that emit red (R), green (G), and blue (B) light, and if necessary, may further comprise an organic light-emitting material that emits white (W) light.

The second bank 43 is located between the first electrodes 30 neighboring in the first direction, so that the organic light-emitting materials of different colors, deposited into the corresponding second openings OA2 neighboring in the first direction, are kept from being mixed together. That is, the organic light-emitting materials of different colors deposited into different second openings OA2 are physically separated by the second bank 43.

The organic light-emitting material used to form the organic light-emitting layer 50 in the solution process is deposited in such a way as to cover at least part of the first electrodes 30, part of the first bank 41, and part of the second bank 43. The first bank 41 is a hydrophilic thin film provided to prevent a wettability problem due to the hydrophobic nature of the first electrode 30, and allows the hydrophilic, organic light-emitting material to spread well. The second bank 43 is a hydrophobic thick film that can prevent the hydrophilic organic light-emitting material from piling up at the edge portion closing to the second bank 43. Therefore, the organic light-emitting material is coated on the first electrodes 30 with a relatively uniform thickness. By the combined structure of the first bank 41 and the second bank 43, the organic light-emitting layer 50 may be made relatively uniform in thickness in the emission regions. In an embodiment, the first bank 41 and the second bank 43 can be simultaneously formed by using a half-tone mask. For example, the first bank 41 and the second bank can be formed by using a half-tone mask having a semi-transmitting portion corresponding to the second bank 43 and a transmitting portion corresponding to the first bank 41.

Furthermore, when one second opening OA2 exposes one first electrode 30, an organic light-emitting material having different thicknesses may be deposited to the second openings OA2 due to an equipment deviation in the solution process. The equipment deviation may mean a discharge rate deviation in nozzles of inkjet equipment. That is, nozzles used to deposit an organic light-emitting material to the second openings OA2 may not have a uniform discharge rate. In this case, the organic light-emitting material deposited to sub-pixels SP through nozzles respectively allocated to the sub-pixels SP may have different thicknesses based on location.

According to the present disclosure, a plurality of sub-pixels SP can be allocated to one second opening OA2 and a number of nozzles corresponding to the number of sub-pixels SP can be allocated, and thus a discharge rate deviation in nozzles can be compensated and an organic light-emitting material deposited to the second openings OA2 can be coated to a uniform thickness.

Accordingly, the organic light-emitting display device according to the present disclosure may prevent deterioration in the uniformity of the organic light-emitting layer 50, thereby preventing a decrease in display quality due to varying thicknesses in the sub-pixels SP. Moreover, a decline in the device's lifetime or imperfections like dark spot formation may be prevented by ensuring the uniformity of the organic light-emitting layer 50.

The aforementioned preset distance between the boundary of the first bank 41 and the boundary of the second bank 43 refers to the distance between the inner surface of the first bank 41 and the inner surface of the second bank 43. If the distance between the boundary of the first bank 41 and the boundary of the second bank 43 is shorter than the preset distance, the organic light-emitting layer 50 cannot be made uniform. If the distance between the boundary of the first bank 41 and the boundary of the second bank 43 is greater than the preset distance, the area of the first electrodes 30 which is enclosed by the first bank 41 increases, which can cause problems such as a small aperture ratio.

In the organic light-emitting display device according to the present disclosure, the second openings OA2 of the second bank 43 extend in the second direction, so that the second bank 43 is not located between the sub-pixels SP neighboring in the second direction. Hence, in the present disclosure, the aforementioned positional constraints on the first bank 41 become relatively loose, thereby improving the degree of design freedom and providing wide emission regions on the first electrodes 30. Therefore, the present disclosure may provide an organic light-emitting display device that offers a higher degree of design freedom and ensures a sufficiently large aperture ratio.

Moreover, in a high-resolution display device, the area of the sub-pixels SP is relatively smaller. In this case, organic light-emitting material is not deposited to its proper position, which may cause mixing of different colors of the organic light-emitting layer 50—that is, a color mixing defect. The present disclosure has the advantage of improving such a color mixing defect, because organic light-emitting material is deposited onto a sufficiently large area in a second opening OA2 corresponding to a plurality of sub-pixels SP.

Referring further to FIG. 5, particles may remain on a specific sub-pixel SP when an organic light-emitting material is coated through the solution process. In this case, the organic light-emitting material does not uniformly spread in the second opening OA2 may be concentrated around the particles. In this case, since light-emitting layer 50 has a thickness deviation based on location, luminance non-uniformity may occur to considerably decrease the display quality of the organic light emitting display device.

To prevent this, the second opening OA2 may further comprise a connecting portion 130 which is relatively smaller in width. The connecting portion 130 may be placed between neighboring sub-pixels SP in a preset region. Alternatively, the connecting portion 130 may be placed between neighboring first electrodes 30 in a preset region.

For example, the first electrodes 30 may comprise (1-1)th electrodes 30-1 and (1-2)th electrodes 30-2, each pair of which is exposed through one second opening OA2. In this case, the second opening OA2 comprises a first portion 110 exposing a (1-1)th electrode 30-1, a second portion 120 exposing a (1-2)th electrode 30-2, and a connecting portion 130 connecting the first portion 110 and the second portion 120. The connecting portion 130 has a smaller width than the first portion 110 and the second portion 120.

The connecting portion 130 may be configured to have a smaller width than the first portion 110 and the second portion 120, and controls the flow of the organic light-emitting material deposited into the second opening OA2. That is, in the present disclosure, the second openings OA2 exposing a plurality of first electrodes 30 may be formed so that the organic light-emitting materials dropped into the second openings OA2 flow on the first electrodes 30, and the connecting portions 130 may be formed to limit an excessive flow of organic light-emitting materials toward a specific region.

In the present disclosure, even if particles are left behind on particular sub-pixels SP in the solution process, the formation of a lump of deposited organic light-emitting material due to the particle may be reduced. Accordingly, the present disclosure has the advantage of effectively preventing the problem of non-uniform brightness due to varying thicknesses of the organic light-emitting layer 50.

Figure 6:
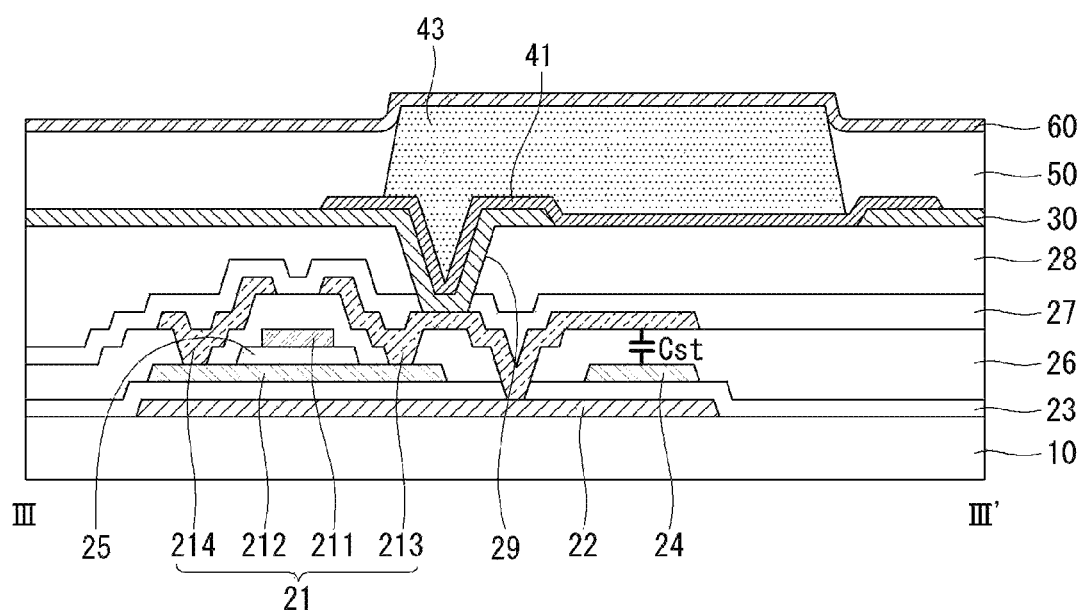
FIG. 6 is a cross-sectional view taken along the line in FIG. 2 according to one embodiment of the present disclosure.

FIG. 6 is a cross-sectional view taken along the line in FIG. 2.

Referring to FIG. 6, the circuit element layer 20 and the organic light-emitting diodes provided in the circuit element layer 20 are placed on the substrate 10. The circuit element layer 20 may comprise transistors 21 electrically connected to the organic light-emitting diodes. For example, the gate electrode 211 of the transistor 21 may be electrically connected to a first electrode 30 of the OLED. In an example, a light shielding layer 22 is placed on the substrate 10. The light shielding layer 22 shields light coming from the outside and prevents photo-current from being generated in the transistors 21. A buffer layer 23 is placed on the light shielding layer 22. The buffer layer 23 serves to protect thin-film transistors formed in a subsequent process from impurities such as alkali ions leaking out of the first substrate SUB1. The buffer layer 23 may be a silicon oxide (SiOx), a silicon nitride (SiNx), or multiple layers of these compounds.

A semiconductor layer 212 of the transistors 21 is placed on the buffer layer 23, and a capacitor lower electrode 24 is located apart from it. The semiconductor layer 212 and the capacitor lower electrode 24 may be formed of silicon semiconductor or oxide semiconductor. The silicon semiconductor may comprise amorphous silicon or crystallized polycrystalline silicon. The semiconductor layer 212 comprises a drain region and a source region each including p-type or n-type impurities, and also comprises a channel between the drain region and the source region. The capacitor lower electrode 24 may become conductive by being doped with impurities.

A gate insulating film 25 is placed on the semiconductor layer 212 and the capacitor lower electrode 24. The gate insulating film 25 may be silicon oxide SiOx, silicon nitride SiNx, or multiple layers of these compounds. A gate electrode 211 is placed on the gate insulating film 25, corresponding to a certain area of the semiconductor layer 212, that is, a channel for injecting an impurity. The gate electrode 211 may be made up of one of molybdenum (Mo), aluminum (Al), chrome (Cr), gold (Au), titanium (Ti), nickel (Ni), neodymium (Nd), or copper (Cu) or multiple layers of alloys of these elements. Further, the gate electrode 211 may be a multilayer formed of one of molybdenum (Mo), aluminum (Al), chrome (Cr), gold (Au), titanium (Ti), nickel (Ni), neodymium (Nd), copper (Cu), or alloys of these elements. For example, the gate electrode 211 may comprise of dual layers of molybdenum/aluminum-neodymium or molybdenum/aluminum.

An interlayer insulating film 26 for insulating the gate electrode 211 is placed on the gate electrode 211. The interlayer insulating film 26 may be a silicon oxide film (SiOx), a silicon nitride film (SiNx), or multiple layers of these compounds. A drain electrode 213 and a source electrode 214 are placed on the interlayer insulating film 26. The drain electrode 213 and the source electrode 214 are connected to the semiconductor layer 212 via contact holes exposing the source region of the semiconductor layer 212. The source electrode 213 and the drain electrode 214 may comprise of a single layer or multiple layers. If the source electrode 213 and the drain electrode 214 comprise of a single layer, they may be made up of one of molybdenum (Mo), aluminum (Al), chrome (Cr), gold (Au), titanium (Ti), nickel (Ni), neodymium (Nd), or copper (Cu), or an alloy of these elements. On the other hand, if the source electrode 213 and the drain electrode 214 comprise of multiple layers, they may be made up of two layers of molybdenum/aluminum-neodymium or three layers of titanium/aluminum/titanium, molybdenum/aluminum/molybdenum, or molybdenum/aluminum-neodymium/molybdenum. As such, a transistor 21 comprising the semiconductor layer 212, the gate electrode 211, the drain electrode 213, and the source electrode 214 is formed. Also, the drain electrode 214, which serves as a capacitor upper electrode, and the capacitor lower electrode 24 constitute a capacitor Cst.

A passivation film 27 is placed on the substrate 10 comprising the transistors 21 and the capacitor Cst. The passivation film 27 is an insulating film that protects the underlying elements, and may be a silicon oxide film (SiOx), a silicon nitride film (SiNx), or multiple layers of these compounds. An overcoat layer 28 is placed on the passivation film 27. The overcoat layer 28 may be a planarization film for smoothing out step differences on the underlying structure, and is made of an organic material such as polyimide, benzocyclobutene-based resin, acrylate, etc. Sub-pixel contact holes 29 are located in a region of the overcoat layer 28, which expose the source electrode 213 by exposing the passivation film 27.

The organic light-emitting diodes are placed on the overcoat layer 28. Each organic light-emitting diode comprises a first electrode 30 connected to the transistor 21, a second electrode 60 facing the first electrode 30, and the organic light-emitting layer 50 interposed between the first electrode 30 and the second electrode 60. The first electrode 30 may be an anode, and the second electrode 60 may be a cathode.

The first electrodes 30 are placed on the overcoat layer 28, and may be connected to the source electrodes 213 of the transistors through sub-pixel contact holes 29 penetrating the overcoat layer 28. One first electrode 30 may be allocated per sub-pixel, but not limited thereto. The first electrode 30 may be made of a transparent conductive material, for example, ITO (indium tin oxide), IZO (indium zinc oxide), or ZnO (zinc oxide) according to a selected emission method and function as a transmissive electrode, or may include a reflective layer and function as a reflective electrode. The reflective layer may be made of aluminum (Al), copper (Cu), silver (Ag), nickel (Ni), or an alloy of these elements, preferably, APC (silver/palladium/copper alloy).

A bank 40 is placed on the substrate 10 where the first electrodes 30 are formed. The bank 40 comprises a first bank 41 and a second bank 43. The first bank 41 and the second bank 43 comprise openings that expose most of the first electrodes 30.

The organic light-emitting layer 50 is placed on the substrate 10 where the bank 40 is formed. The organic light-emitting layer 50 may further comprise one or more layers including an emission layer EML, a hole injection layer HIL, a hole transport layer HTL, an electron transport layer ETL, and an electron injection layer EIL.

The second electrodes 60 are placed on the organic light-emitting layer 50. The second electrodes 60 may be formed widely over the entire surface of the substrate 10. The second electrodes 60 may function as transmissive electrodes or reflective electrodes according to a selected emission method. If the second electrodes 60 are transmissive electrodes, the second electrodes 60 may be made of a transparent conductive material, such as ITO (indium tin oxide), IZO (indium zinc oxide), or ZnO (zinc oxide), and may be made of magnesium (Mg), calcium (Ca), aluminum (Al), silver (Ag), or an alloy thereof that is thin enough to pass light through. The structure shown in FIG. 6 may be applicable to other sub-pixels as well as the sub-pixels concerned.

Second Exemplary Embodiment

Figure 7:
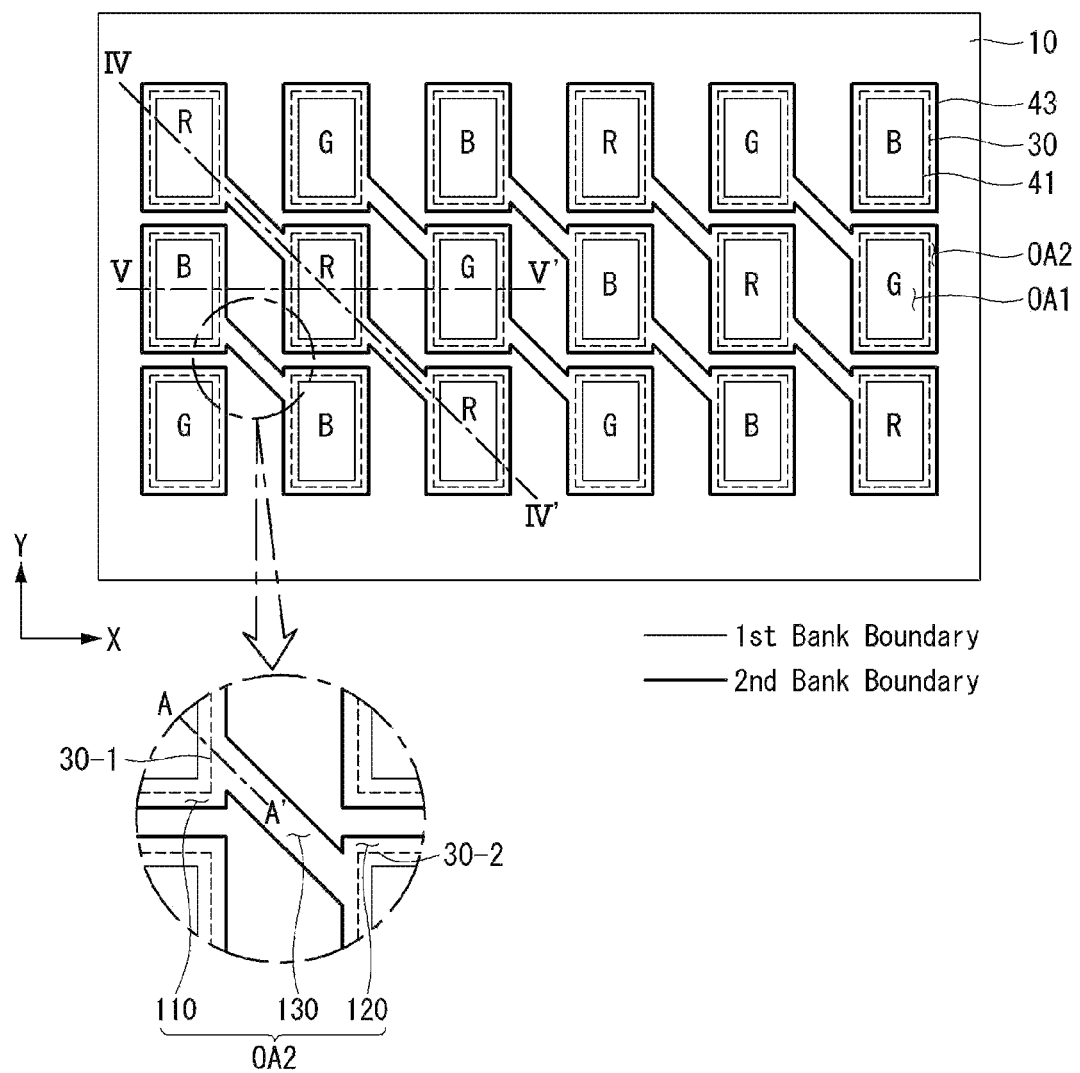
FIG. 7 is a schematic plan view of an organic light-emitting display device according to a second exemplary embodiment of the present disclosure.
Figure 8:
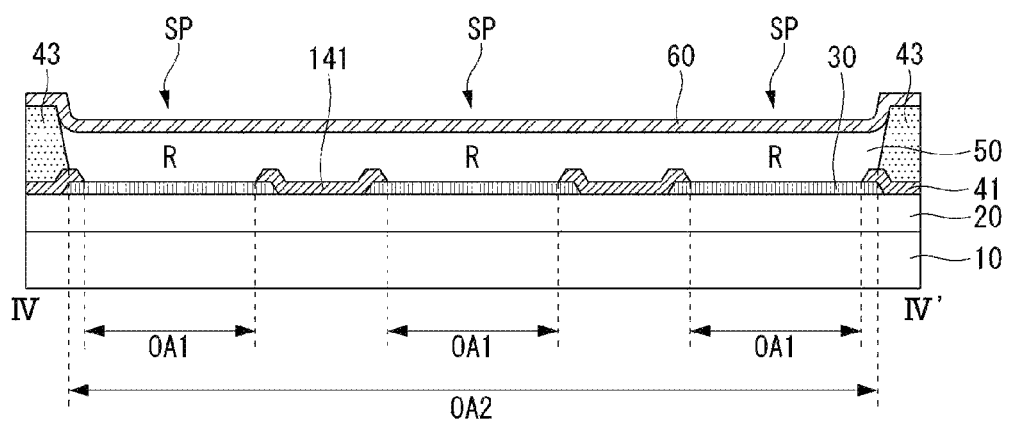
FIG. 8 is a cross-sectional view taken along the line IV-IV' in FIG. 7 according to one embodiment of the present disclosure.
Figure 9:
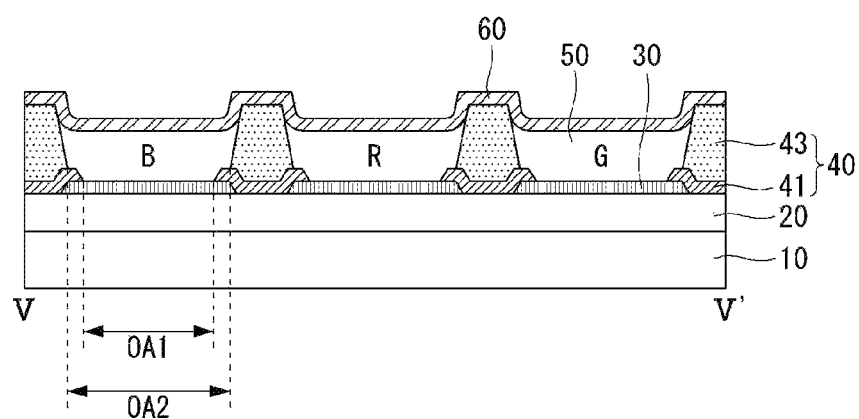
FIG. 9 is a cross-sectional view taken along the line V-V' in FIG. 7 according to one embodiment of the present disclosure.

FIG. 7 is a schematic plan view of an organic light-emitting display device according to a second exemplary embodiment of the present disclosure. FIG. 8 is a cross-sectional view taken along the line IV-IV' in FIG. 7. FIG. 9 is a cross-sectional view taken along the line V-V' in FIG. 7. FIG. 10 is a view for comparatively explaining a structure of the first exemplary embodiment and a structure of the second exemplary embodiment. FIG. 11 is a view for explaining a modification of the second exemplary embodiment.

Referring to FIGS. 7 to 9, the organic light-emitting display device according to the second exemplary embodiment comprises a substrate 10 where sub-pixels SP are arranged. The substrate 10 may have various planar shapes, for example, all planar shapes such as square, circular, and elliptical, as well as the rectangular shape shown in the drawings. A first direction (for example, X direction) and a second direction (for example, Y direction), which intersect at a right angle, are defined on the substrate 10, regardless of the planar shape of the substrate 10. The positions and arrangements of sub-pixels and/or openings to be described later may be defined by the first and second axes.

A circuit element layer 20 and organic light-emitting diodes, which are driven by the elements provided in the circuit element layer 20, are placed on the substrate 10.

Signal lines and electrodes for applying driving signals to the organic light-emitting diodes may be arranged on the circuit element layer 20, and the signal lines and the electrodes may be placed separately with at least one insulating layer between them if necessary. If the organic light-emitting display device is an active matrix (AM) display, the circuit element layer 20 may further comprise a transistor allocated per sub-pixel SP.

Each organic light-emitting diode comprises a first electrode 30, a second electrode 60, and an organic light-emitting layer 50 interposed between the first electrode 30 and the second electrode 60. The first electrode 30 may be an anode, and the second electrode 60 may be a cathode.

More specifically, the sub-pixels SP may be arranged along the first direction (e.g., X direction) and second direction (e.g., Y direction) which intersect each other. Two sub-pixels SP arranged neighboring along the first direction may emit light of different colors. Two sub-pixels SP arranged neighboring along the second direction may emit light of different colors. The sub-pixels SP arranged in an oblique direction which are not parallel to the first and second directions may emit light of the same color. In other words, the sub-pixels SP arranged along a third direction which extend at a predetermined angle of tilt with respect to the first and second directions may emit light of the same color. Here, the predetermined angle may be set in a range of $0<\theta<90°$. The angle between the third direction and the first direction and the angle between the third direction and the second direction are tilted angles (or tilt angles). For convenience of explanation, the direction in which sub-pixels SP emitting light of the same color are arranged will be referred to as the third direction. The first electrodes 30 of the organic light-emitting diodes are placed in the sub-pixels SP. One first electrode 30 may be allocated per sub-pixel SP.

A bank 40 is placed on the first electrodes 30. The bank 40 comprises a first bank 41 and a second bank 43.

The first bank 41 is located on the first electrodes 30. The first bank 41 comprises first openings OA1 exposing at least part of the first electrodes 30. Each first opening OA1 exposes one first electrode 30. Thus, the number of first openings OA1 and the number of first electrodes 30 may be equal.

The first bank 41 may be made relatively thin so as to be covered by the organic light-emitting layer 50. The first bank 41 may be hydrophilic. In an example, the first bank 41 may be formed of a hydrophilic, inorganic insulating material such as silicon oxide (SiO2) or silicon nitride (SiNx).

Although the drawings illustrate that the first openings OA1 are approximately rectangular, they are not limited to this shape. Also, the drawings illustrate that all of the first openings OA1 have the same shape and area, but they are not limited to this and at least one first opening OA1 may have a different shape and/or area from another first opening OA1. For example, the shape and/or area of the first openings OA1 may be properly selected in view of the lifetime of organic light-emitting materials for forming the organic light-emitting layer 50 of the organic light-emitting diodes. Parts of the first electrodes 30 exposed by the first openings OA1 may be defined as emission regions.

The second bank 43 is placed on the substrate 10 where the first bank 41 is formed. The second bank 43 comprises second openings OA2 exposing at least part of the first electrodes 30. A plurality of second openings OA2 are arranged in parallel in the third direction, and extend in the third direction. The second openings OA2 extend in the third direction and expose a plurality of first electrodes 30 arranged along the third direction. Alternatively, the second openings OA2 extend in the third direction and expose a plurality of first openings OA1 arranged along the third direction. In some regions, the second openings OA2 each may expose only one first electrode 30 or only one first opening OA1.

The second bank 43 may be hydrophobic. In an example, the second bank 43 may be formed with a hydrophobic material coated on an insulating material or formed with an insulating material containing a hydrophobic material. The second bank 43 may be made of organic material. The hydrophobic nature of the second bank 43 may allow the organic light-emitting material constituting the organic light-emitting layer 50 to be coated with a relatively uniform thickness. Also, the second bank 43 may function as a barrier that encloses the organic light-emitting material deposited into a corresponding region to prevent organic light-emitting materials of different colors from being mixed together.

Although the drawings illustrate that the second openings OA2 are approximately rectangular, they are not limited to this shape. Also, the drawings illustrate that all of the second openings OA2 have the same shape and area, but they are not limited to this and at least one second opening OA2 may have a different shape and/or area from another second opening OA2. For example, the shape and/or area of the second openings OA2 may be properly selected in view of the lifetime of organic light-emitting materials.

The second openings OA2 are located on the outside of the first openings OA1, at a distance from them. That is, the boundary of the first bank 41 is spaced a preset distance apart from the boundary of the second bank 43. Therefore, the first openings OA1 may be exposed by the second openings OA2.

The organic light-emitting layer 50 is placed on the substrate 10 where the second bank 43 is formed. The organic light-emitting layer 50 may be formed within the corresponding second openings OA2, in the direction in which the second openings OA2 extend. That is, the organic light-emitting material deposited into one second opening OA2 covers the first electrodes 30 and first bank 41 exposed by the second opening OA2, and are not physically separated by the first bank 41.

Organic light-emitting material of the same color is deposited on a plurality of first electrodes 30 exposed by one second opening OA2. This means that a plurality of sub-pixels SP allocated to positions corresponding to one second opening OA2 emit light of the same color. The planar shape of the organic light-emitting layer 50 may correspond to the planar shape of the second openings OA2.

Organic light-emitting materials of different colors may be sequentially and alternately deposited in their corresponding second openings OA2. The organic light-emitting materials of different colors may comprise organic light-emitting materials that emit red (R), green (G), and blue (B) light, and if necessary, may further comprise an organic light-emitting material that emits white (W) light.

The second bank 43 is located between the first electrodes 30 neighboring in the first and second directions, so that the organic light-emitting materials of different colors, deposited into the corresponding second openings OA2 neighboring in the first direction, are kept from being mixed together. That is, the organic light-emitting materials of different colors deposited into different second openings OA2 are physically separated by the second bank 43.

The organic light-emitting material used to form the organic light-emitting layer 50 in the solution process is deposited in such a way as to cover at least part of the first electrodes 30, part of the first bank 41, and part of the second bank 43. The first bank 41 is a hydrophilic thin film provided to prevent a wettability problem due to the hydrophobic nature of the first electrode 30, and allows the hydrophilic, organic light-emitting material to spread well. The second bank 43 is a hydrophobic thick film that can prevent the hydrophilic organic light-emitting material from piling up at the edge portion closing to the second bank 43. Therefore, the organic light-emitting material is coated on the first electrodes 30 with a relatively uniform thickness. By the combined structure of the first bank 41 and the second bank 43, the organic light-emitting layer 50 may be made relatively uniform in thickness in the emission regions.

Each second opening OA2 may further comprise a connecting portion 130 which is relatively smaller in width. The connecting portion 130 may be placed between sub-pixels SP in a preset region that are arranged along the third direction and emit light of the same color. Alternatively, the connecting portion 130 may be placed between first electrodes 30 in a preset region that are arranged along the third direction and emit light of the same color. The connecting portion 130 may extend in the third direction, but is not limited thereto.

For example, the first electrodes 30 may comprise (1-1)th electrodes 30-1 and (1-2)th electrodes 30-2, each pair of which is exposed through one second opening OA2. In this case, the second opening OA2 comprises a first portion 110 exposing a (1-1)th electrode 30-1, a second portion 120 exposing a (1-2)th electrode 30-2, and a connecting portion 130 connecting the first portion 110 and the second portion 120. The connecting portion 130 has a smaller width than the first portion 110 and the second portion 120.

The connecting portion 130 may be configured to have a smaller width than the first portion 110 and the second portion 120, and control the flow of the organic light-emitting material dropped into the second opening OA2. That is, in the present disclosure, the second openings OA2 exposing a plurality of first electrodes 30 may be formed so that the organic light-emitting materials dropped into the second openings OA2 flow on the first electrodes 30, and the connecting portions 130 may be formed to limit an excessive flow of organic light-emitting materials toward a specific region.

The present disclosure can reduce concentration of the organic light-emitting material deposited to the second opening OA2 on particles even if the particles remain on a specific sub-pixel SP in the solution process. Accordingly, the present disclosure can effectively prevent luminance non-uniformity due to a thickness deviation in the organic emission layer 50.

The connecting portions 130 need to be of a predetermined length to provide a predetermined fluid resistance since they are components for limiting the flow of organic light-emitting material. However, in the case of a high-resolution display with a high PPI (pixels per inch), the sub-pixels SP are spaced out relatively small distances apart. This may make it difficult to form connecting portions 130 between the sub-pixels SP spaced small distances apart, and the connecting portions 130 do not have sufficient length.

Figure 10A:
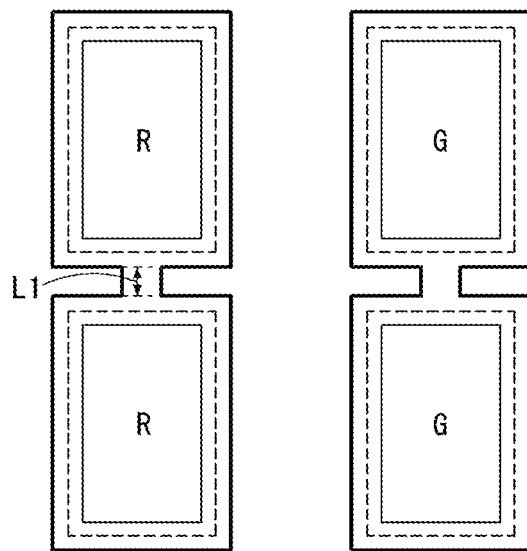
FIGS. 10A and 10B are views for comparatively explaining a structure of the first exemplary embodiment and a structure of the second exemplary embodiment.
Figure 10B:
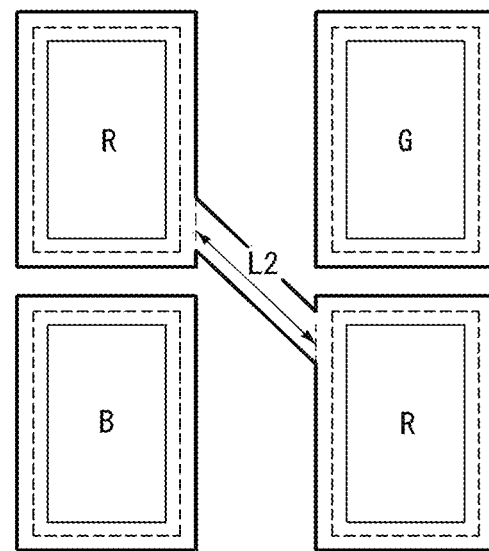

Referring further to FIGS. 10A and 10B, the connecting portions 130 according to the second exemplary embodiment of the present disclosure are located between the sub-pixels neighboring in the third direction. Accordingly, the length L2 of the connecting portions 130 in FIG. 10B can be long compared to the structure of the first exemplary embodiment in which the length L1 of the connecting portions 130 are formed between the sub-pixels neighboring in the first direction as shown in FIG. 10A. That is, assuming that neighboring sub-pixels are spaced out at regular intervals, the length L2 of the connecting portions 130 located between the sub-pixels neighboring in the third direction are longer than the length L1 of the connecting portions 130 located between the sub-pixels neighboring in the first direction. The second exemplary embodiment of the present disclosure has the advantage of significantly reducing the problem of non-uniform brightness due to varying thicknesses of the organic light-emitting layer 50, because the flow of dropped organic light-emitting material can be effectively controlled due to the sufficient length of the connecting portions 130.

Figure 11A:
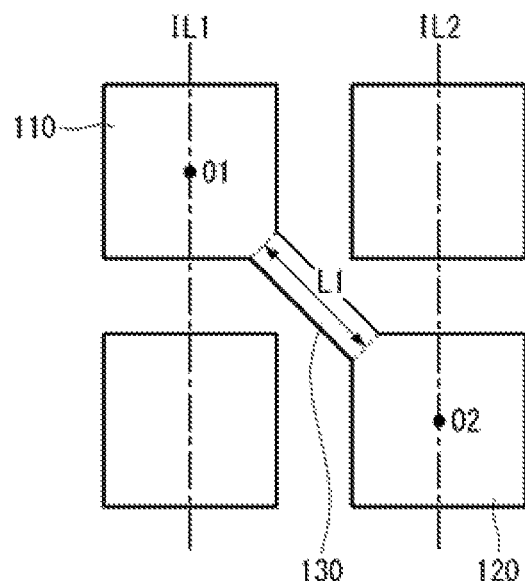
FIGS. 11A and 11B are views for explaining a modification of the second exemplary embodiment.
Figure 11B:
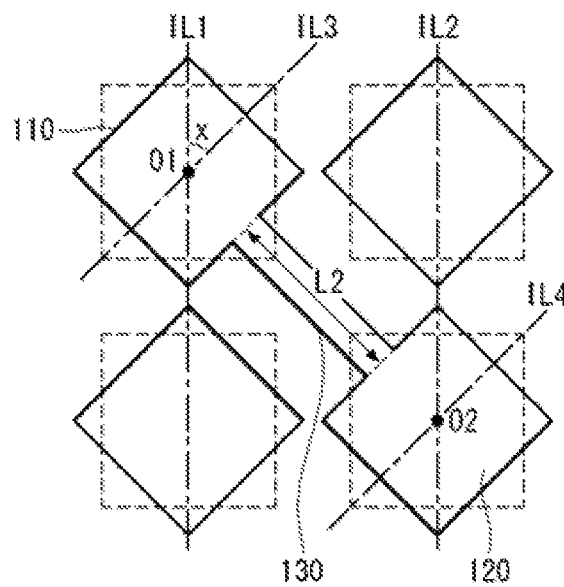

Referring to FIGS. 11A and 11B, in the second exemplary embodiment of the present disclosure, the planar shape of the second openings OA2 may be varied in order to make the connecting portions 130 have sufficient length.

For example, referring to FIG. 11A, the second openings OA2 each may comprise a first portion 110 and a second portion 120 which are connected by a connecting portion 130. The planar shape of the first portion 110 may be symmetrical with respect to a first virtual line IL1 that runs across the center O1 of the first portion 110. That is, the first virtual line IL1 may be the symmetry axis of the first portion 110. The first virtual line IL1 is parallel to the first direction. The planar shape of the second portion 120 may be symmetrical with respect to a second virtual line IL2 that runs across the center O2 of the second portion 120. That is, the second virtual line IL2 may be the symmetry axis of the second portion 120. The second virtual line IL2 is parallel to the first virtual line IL1.

Referring to FIG. 11B, the second openings OA2 are tilted at a preset angle (x). The second openings OA2 each may comprise a first portion 110 and a second portion 120 which are connected by a connecting portion 130. The planar shape of the tilted first portion 110 may be symmetrical with respect to a third virtual line IL3 that runs across the center O1 of the first portion 110. That is, the third virtual line IL3 may be the symmetry axis of the tilted first portion 110. The third virtual line IL3 is tilted at a preset angle (x) with respect to the first virtual line ILL The planar shape of the tilted second portion 120 may be symmetrical with respect to a fourth virtual line IL4 that runs across the center O2 of the second portion 120. That is, the fourth virtual line IL4 may be the symmetry axis of the tilted second portion 120. The fourth virtual line IL4 is tilted at a preset angle (x) with respect to the second virtual line IL2. The preset angle (x) may be set in a range of 0 to 90°.

As illustrated in the drawing, the connecting portions 130 may have sufficient length by tilting the first portions 110 and the second portions 120 at a preset angle (x). The length L2 of the connecting portions 130 connecting the first portions 110 and the second portions 120 after tilting is longer than the length L1 of the connecting portions 130 connecting the first portions 110 and the second portions 120 before tilting.

Figure 12:
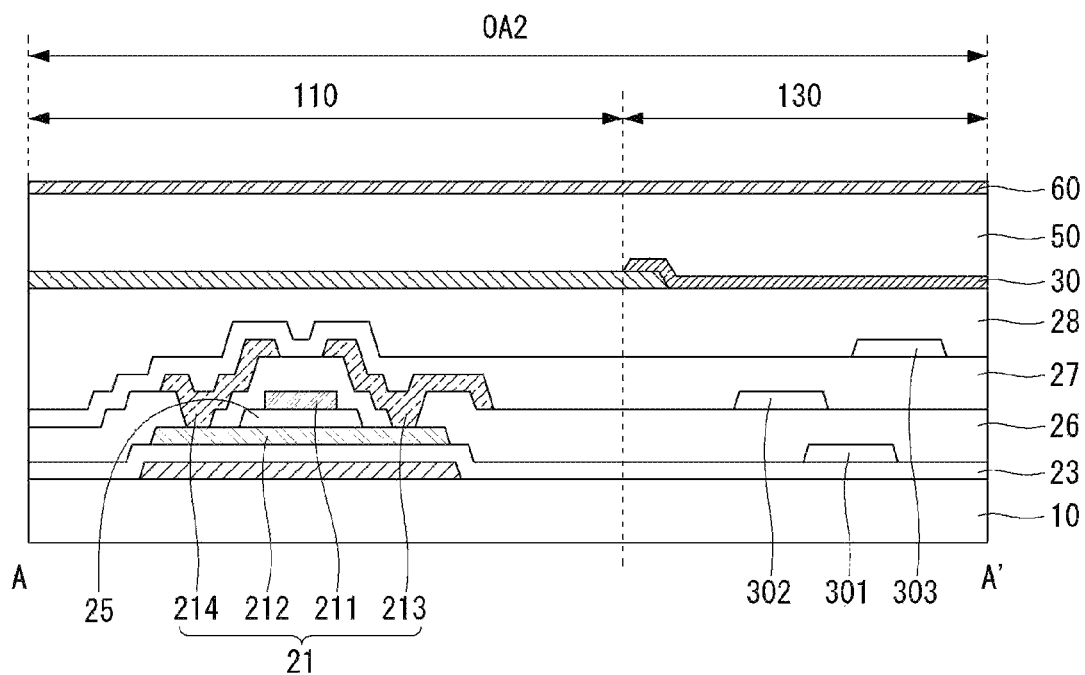
FIG. 12 is a view for explaining a positional relationship between second openings of a second bank and a circuit element layer according to one embodiment of the present disclosure.

FIG. 12 is a view for explaining a positional relationship between the second openings of the second bank and the circuit element layer.

Referring to FIG. 12, the second bank 43 comprises second openings OA2 exposing a plurality of first electrodes 30. The second openings OA2 comprise first portions 110 exposing the first electrodes 30 and connecting portions 130 connecting the first portions 110.

The transistors 21 allocated to the corresponding sub-pixels may be located in regions corresponding to the first portions 110. Each transistor comprises a gate electrode 211, a semiconductor layer 212, and source/drain electrodes 213 and 214. Although the transistors 21 are illustrated as having a top gate structure by way of example, they may be implemented in various structures such as a bottom gate structure and a double gate structure. The transistors 21 may be implemented as p-type or n-type. The semiconductor layer 212 forming the transistors 21 may comprise amorphous silicon, polycrystalline silicon, or oxide.

Signal lines 301, 302, and 303 connected to the transistors 21 apply driving signals to the corresponding sub-pixels and may be located in the connecting portions 130. The signal lines 301, 302, and 303 may comprise gate lines for applying gate signals to the sub-pixels, data lines for applying data signals to the sub-pixels, high-level power supply lines for applying high-level power to the sub-pixels, and low-level power supply lines for applying low-level power to the sub-pixels. If necessary, like if compensation circuits are added to the sub-pixels, the signal lines 301, 302, and 303 may further comprise sensing lines for sensing the electrical characteristics of the sub-pixels.

The signal lines 301, 302, and 303 may be located in the connecting portions 130 and extend between adjacent first portions 110. Also, the signal lines 301, 302, and 303 may be formed on different layers, with at least one insulating layer 23, 26, 27, and 28 in between, in the regions corresponding to the connecting portions 130. For example, the gate lines may be placed on the same layer as the gate electrodes 211. The data lines, high-level power supply lines, and low-level power supply lines may be placed on the same layer as the source/drain electrodes 213 and 214. The sensing lines may be placed on the same layer as the source/drain electrodes 213 and 214 or on the same layer as the light shielding layer 22. If necessary, any one of the signal lines 301, 302, and 303 may be segmented into a plurality of lines placed on different layers, and these line segments may be electrically connected through contact holes penetrating the insulating layer placed between them.

Third Exemplary Embodiment

Figure 13:
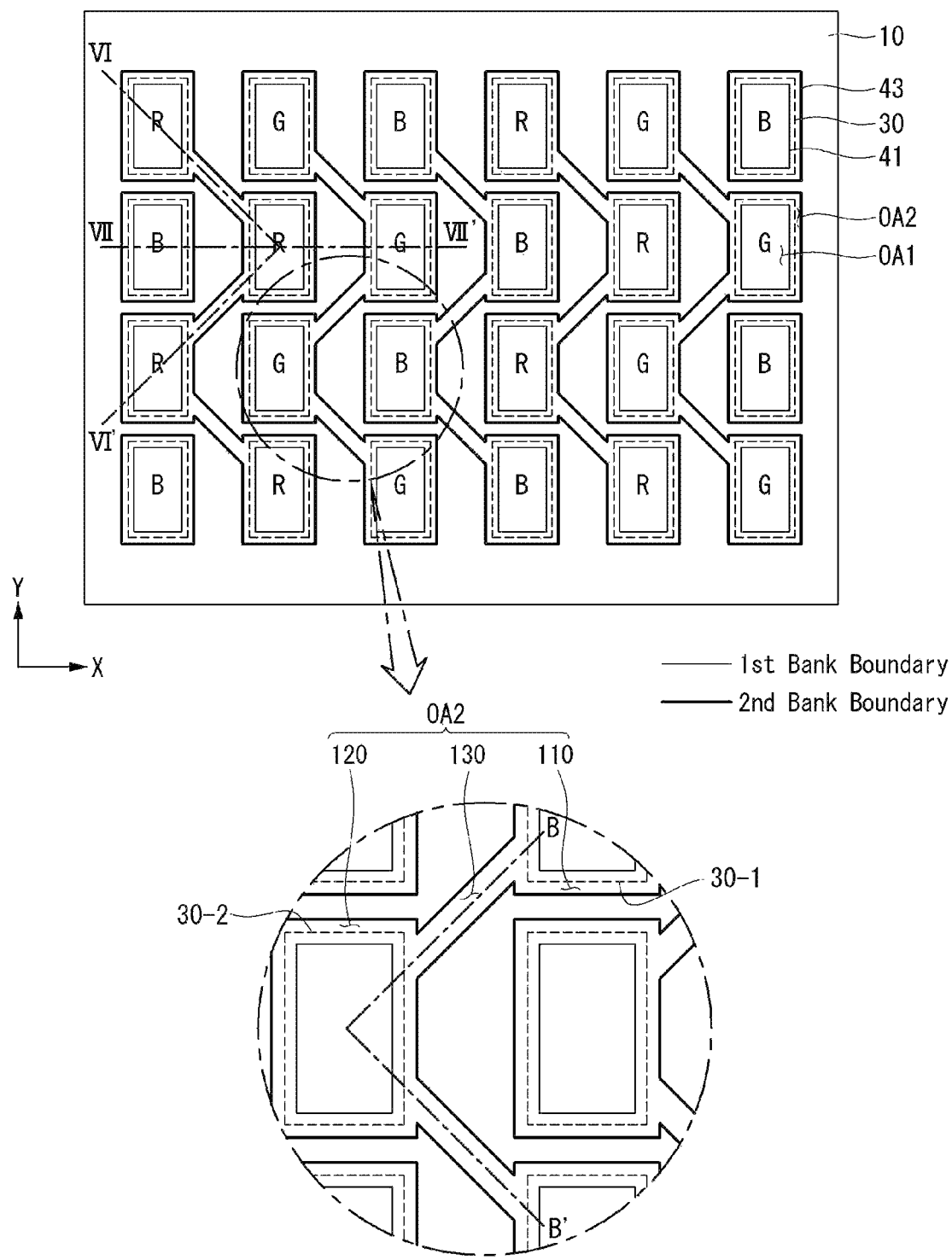
FIG. 13 is a schematic plan view of an organic light-emitting display device according to a third exemplary embodiment of the present disclosure.
Figure 14:
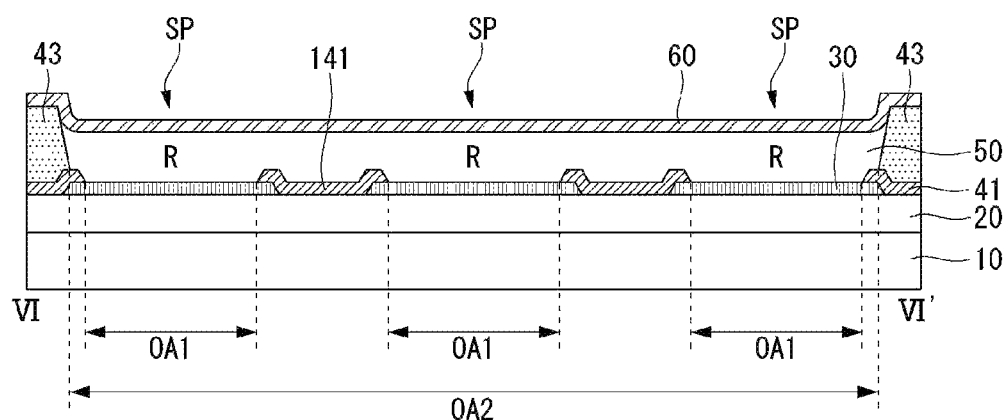
FIG. 14 is a cross-sectional view taken along the line VI-VI' in FIG. 13 according to one embodiment of the present disclosure.
Figure 15:
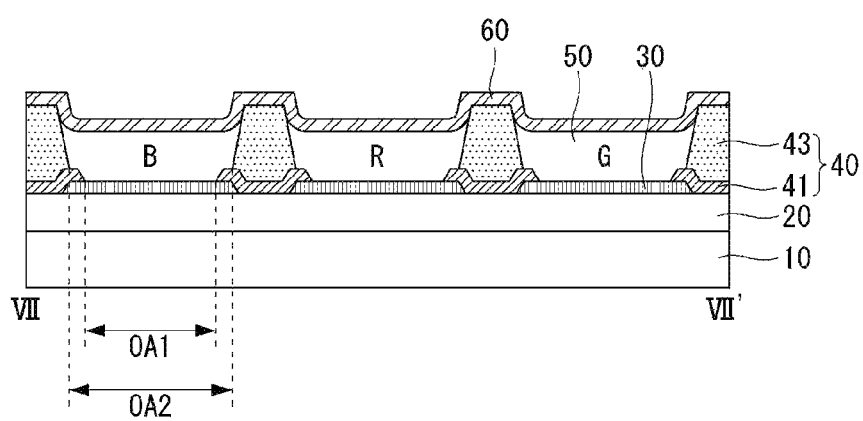
FIG. 15 is a cross-sectional view taken along the line VII-VII' in FIG. 13 according to one embodiment of the present disclosure.

FIG. 13 is a schematic plan view of an organic light-emitting display device according to a third exemplary embodiment of the present disclosure. FIG. 14 is a cross-sectional view taken along the line VI-VI' in FIG. 13. FIG. 15 is a cross-sectional view taken along the line VII-VII' in FIG. 13.

Referring to FIGS. 13 to 15, the organic light-emitting display device according to the third exemplary embodiment comprises a substrate 10 where sub-pixels SP are arranged. The substrate 10 may have various planar shapes, for example, all planar shapes such as square, circular, and elliptical, as well as the rectangular shape shown in the drawings. A first direction (for example, X direction) and a second direction (for example, Y direction), which intersect at a right angle, are defined on the substrate 10, regardless of the planar shape of the substrate 10. The positions and arrangements of sub-pixels and/or openings to be described later may be defined by the first and second axes.

A circuit element layer 20 and organic light-emitting diodes, which are driven by the elements provided in the circuit element layer 20, are placed on the substrate 10.

Signal lines and electrodes for applying driving signals to the organic light-emitting diodes may be arranged on the circuit element layer 20, and the signal lines and the electrodes may be placed separately with at least one insulating layer between them if necessary. If the organic light-emitting display device is an active matrix (AM) display, the circuit element layer 20 may further comprise a transistor allocated per sub-pixel SP.

Each organic light-emitting diode comprises a first electrode 30, a second electrode 60, and an organic light-emitting layer 50 interposed between the first electrode 30 and the second electrode 60. The first electrode 30 may be an anode, and the second electrode 60 may be a cathode.

More specifically, the sub-pixels SP may be arranged along the first direction (e.g., X direction) and second direction (e.g., Y direction) which intersect each other. Two sub-pixels SP arranged neighboring along the first direction may emit light of different colors. Two sub-pixels SP arranged neighboring along the second direction may emit light of different colors. Two sub-pixels SP arranged in an oblique direction which are not parallel to the first and second directions may emit light of the same color. In other words, two sub-pixels SP arranged along a third direction which extend at a predetermined angle of tilt with respect to the first and second directions may emit light of the same color. Here, the predetermined angle may be set in a range of $0<\theta<90°$. The first electrodes 30 of the organic light-emitting diodes are placed in the sub-pixels SP. One first electrode 30 may be allocated per sub-pixel SP.

More specifically, the sub-pixels SP comprise first sub-pixels SP1, second sub-pixels SP2, and third sub-pixels SP3 which emit light of different colors. The sub-pixels SP emitting light of the same color may be arranged in a zigzag shape in a planar view.

The first to third sub-pixels SP1, SP2, and SP3 allocated to odd-numbered columns are arranged in the same way. The first to third sub-pixels SP1, SP2, and SP3 allocated to even-numbered columns are arranged in the same way. The arrangement of the first to third sub-pixels SP1, SP2, and SP3 allocated to odd-numbered columns is different from the arrangement of the first to third sub-pixels SP1, SP2, and SP3 allocated to even-numbered columns.

In an example, the sub-pixels SP may be sequentially and alternately arranged in the odd-numbered columns, in the order of the first sub-pixel SP1, second sub-pixel SP2, and third sub-pixel SP3, starting from a row of first sub-pixels SP1. The sub-pixels SP may be sequentially and alternately arranged in the even-numbered columns, in the order of the third sub-pixel SP3, first sub-pixel SP1, and second sub-pixel SP2, starting from a row of third sub-pixels SP3. This way, the first sub-pixels SP1, second sub-pixels SP2, and third sub-pixels SP3 may be arranged in a zigzag shape in a planar view.

A bank 40 is placed on the first electrodes 30. The bank 40 comprises a first bank 41 and a second bank 43.

The first bank 41 is located on the first electrodes 30. The first bank 41 comprises first openings OA1 exposing at least part of the first electrodes 30. Each first opening OA1 exposes one first electrode 30. Thus, the number of first openings OA1 and the number of first electrodes 30 may be equal.

The first bank 41 may be made relatively thin so as to be covered by the organic light-emitting layer 50. The first bank 41 may be hydrophilic. In an example, the first bank 41 may be formed of a hydrophilic, inorganic insulating material such as silicon oxide ($SiO_2$) or silicon nitride (SiNx).

Although the drawings illustrate that the first openings OA1 are approximately rectangular, they are not limited to this shape. Also, the drawings illustrate that all of the first openings OA1 have the same shape and area, but they are not limited to this and at least one first opening OA1 may have a different shape and/or area from another first opening OA1. For example, the shape and/or area of the first openings OA1 may be properly selected in view of the lifetime of organic light-emitting materials for forming the organic light-emitting layer 50 of the organic light-emitting diodes. Parts of the first electrodes 30 exposed by the first openings OA1 may be defined as emission regions.

The second bank 43 is placed on the substrate 10 where the first bank 41 is formed. The second bank 43 comprises second openings OA2 exposing at least part of the first electrodes 30. A plurality of second openings OA2 are arranged in parallel in the second direction, and extend in a zigzag shape. The second openings OA2 extend in a zigzag shape and expose a plurality of first electrodes 30 arranged in a zigzag shape. Alternatively, the second openings OA2 extend in a zigzag shape and expose a plurality of first openings OA1 arranged in a zigzag shape. In some regions, the second openings OA2 each may expose only one first electrode 30 or only one first opening OA1.

The second bank 43 may be hydrophobic. In an example, the second bank 43 may be formed with a hydrophobic material coated on an insulating material or formed with an insulating material containing a hydrophobic material. The second bank 43 may be made of organic material. The hydrophobic nature of the second bank 43 may allow the organic light-emitting material constituting the organic light-emitting layer 50 to be coated with a relatively uniform thickness. Also, the second bank 43 may function as a barrier that encloses the organic light-emitting material dropped into a corresponding region, so as to prevent organic light-emitting materials of different colors from being mixed together.

Although the drawings illustrate that the second openings OA2 are approximately rectangular, they are not limited to this shape. Also, the drawings illustrate that all of the second openings OA2 have the same shape and area, but they are not limited to this and at least one second opening OA2 may have a different shape and/or area from another second opening OA2. For example, the shape and/or area of the second openings OA2 may be properly selected in view of the lifetime of organic light-emitting materials.

The second openings OA2 are located on the outside of the first openings OA1, at a distance from them. That is, the boundary of the first bank 41 is spaced a preset distance apart from the boundary of the second bank 43. Therefore, the first openings OA1 may be exposed by the second openings OA2.

The organic light-emitting layer 50 is placed on the substrate 10 where the second bank 43 is formed. The organic light-emitting layer 50 may be formed within the corresponding second openings OA2, in the direction in which the second openings OA2 extend. That is, the organic light-emitting material dropped into one second opening OA2 covers the first electrodes 30 and first bank 41 exposed by the second opening OA2, and are not physically separated by the first bank 41.

Organic light-emitting material of the same color is dropped on a plurality of first electrodes 30 exposed by one second opening OA2. This means that a plurality of sub-pixels SP allocated to positions corresponding to one second opening OA2 emit light of the same color. The planar shape of the organic light-emitting layer 50 may correspond to the planar shape of the second openings OA2. That is, the plane of the organic light-emitting layer 50 may have a zigzag shape.

Organic light-emitting materials of different colors may be sequentially and alternately deposited in their corresponding second openings OA2. The organic light-emitting materials of different colors may comprise organic light-emitting materials that emit red (R), green (G), and blue (B) light, and if necessary, may further comprise an organic light-emitting material that emits white (W) light.

The second bank 43 is located between the first electrodes 30 neighboring in the first and second directions, so that the organic light-emitting materials of different colors, deposited into the corresponding second openings OA2 neighboring in the first direction, are kept from being mixed together. That is, the organic light-emitting materials of different colors deposited into different second openings OA2 are physically separated by the second bank 43.

The organic light-emitting material used to form the organic light-emitting layer 50 in the solution process is deposited in such a way as to cover at least part of the first electrodes 30, part of the first bank 41, and part of the second bank 43. The first bank 41 is a hydrophilic thin film provided to prevent a wettability problem due to the hydrophobic nature of the first electrode 30, and allows the hydrophilic, organic light-emitting material to spread well. The second bank 43 is a hydrophobic thick film that can prevent the hydrophilic organic light-emitting material from piling up at the edge portion closing to the second bank 43. Therefore, the organic light-emitting material is coated on the first electrodes 30 with a relatively uniform thickness. By the combined structure of the first bank 41 and the second bank 43, the organic light-emitting layer 50 may be made relatively uniform in thickness in the emission regions.

Each second opening OA2 may further comprise a connecting portion 130 which is relatively smaller in width. The connecting portion 130 may be placed between sub-pixels SP in a preset region that are arranged along the third direction and emit light of the same color. Alternatively, the connecting portion 130 may be placed between first electrodes 30 in a preset region that are arranged along the third direction and emit light of the same color. The connecting portion 130 may extend in the third direction, but is not limited thereto.

For example, the first electrodes 30 may comprise (1-1)th electrodes 30-1 and (1-2)th electrodes 30-2, both of which are exposed through one second opening OA2. In this case, the second opening OA2 comprises a first portion 110 exposing a (1-1)th electrode 30-1, a second portion 120 exposing a (1-2)th electrode 30-2, and a connecting portion 130 connecting the first portion 110 and the second portion 120. The connecting portion 130 has a smaller width than the first portion 110 and the second portion 120.

The connecting portion 130 may be configured to have a smaller width than the first portion 110 and the second portion 120, and control the flow of the organic light-emitting material deposited into the second opening OA2. That is, in the present disclosure, the second openings OA2 exposing a plurality of first electrodes 30 may be formed so that the organic light-emitting materials deposited into the second openings OA2 flow on the first electrodes 30, and the connecting portions 130 may be formed to limit an excessive flow of organic light-emitting materials toward a specific region.

In the present disclosure, even if particles are left behind on particular sub-pixels SP in the solution process, the formation of a lump of deposited organic light-emitting material due to the particles may be reduced. Accordingly, the present disclosure has the advantage of effectively preventing the problem of non-uniform brightness due to varying thicknesses of the organic light-emitting layer 50.

The connecting portions 130 according to the third exemplary embodiment of the present disclosure are located between the sub-pixels neighboring in the third direction. Accordingly, the length L2 of the connecting portions 130 can be longer compared to the structure of the first exemplary embodiment in which the connecting portions 130 are formed between the sub-pixels neighboring in the first direction. That is, assuming that neighboring sub-pixels are spaced out at regular intervals, the length of the connecting portions 130 located between the sub-pixels neighboring in the third direction are longer than the length of the connecting portions 130 located between the sub-pixels neighboring in the first direction. The third exemplary embodiment of the present disclosure has the advantage of significantly reducing the problem of non-uniform brightness due to varying thicknesses of the organic light-emitting layer 50, because the flow of dropped organic light-emitting material can be effectively controlled due to the sufficient length of the connecting portions 130.

Figure 16:
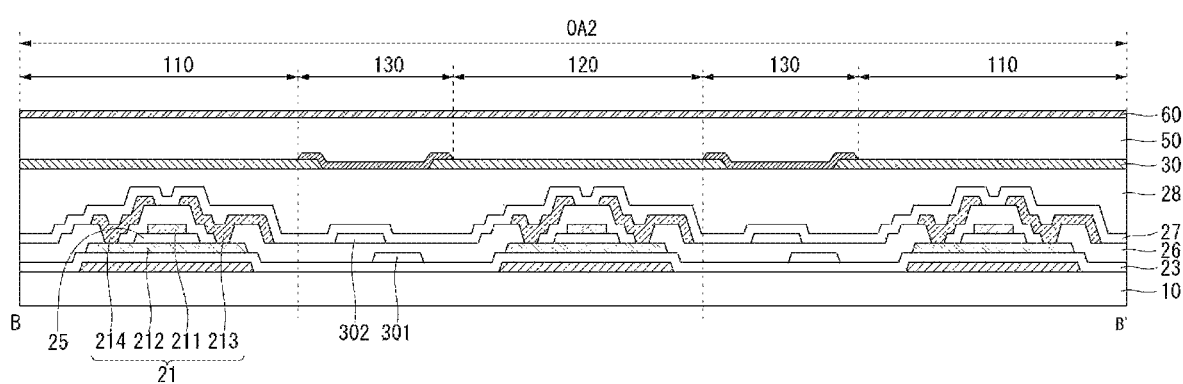
FIG. 16 is a view for explaining a positional relationship between second openings of a second bank and a circuit element layer according to one embodiment of the present disclosure.

FIG. 16 is a view for explaining a positional relationship between the second openings of the second bank and the circuit element layer.

Referring to FIG. 16, the second bank 43 comprises second openings OA2 exposing a plurality of first electrodes 30. The second openings OA2 comprise first portions 110 and second portions 120 which respectively expose (1-1)th electrodes and (1-2)th electrodes arranged in different columns from each other, and connecting portions 130 connecting the first portions 110 and the second portions 120.

The transistors 21 allocated to the corresponding sub-pixels may be located in regions corresponding to the first portions 110 and second portions 120. Each transistor comprises a gate electrode 211, a semiconductor layer 212, and source/drain electrodes 213 and 214. Although the transistors 21 are illustrated as having a top gate structure by way of example, they may be implemented in various structures such as a bottom gate structure and a double gate structure. The transistors 21 may be implemented as p-type or n-type. The semiconductor layer 212 forming the transistors 21 may comprise amorphous silicon, polycrystalline silicon, or oxide.

Signal lines 301 and 302 are connected to the transistors 21 to apply driving signals to the corresponding sub-pixels and may be located in the connecting portions 130. The signal lines 301 and 302 may comprise gate lines for applying gate signals to the sub-pixels, data lines for applying data signals to the sub-pixels, high-level power supply lines for applying high-level power to the sub-pixels, and low-level power supply lines for applying low-level power to the sub-pixels. If necessary, if compensation circuits are added to the sub-pixels, the signal lines 301 and 302 may further comprise sensing lines for sensing the electrical characteristics of the sub-pixels.

The signal lines 301 and 302 may be located in the connecting portions 130 and extend between the first portions 110 and the second portions 120. Also, the signal lines 301 and 302 may be formed on different layers, with at least one insulating layer 23, 26, 27, and 28 in between, in the regions corresponding to the connecting portions 130. For example, the gate lines may be placed on the same layer as the gate electrodes 211. The data lines, high-level power supply lines, and low-level power supply lines may be placed on the same layer as the source/drain electrodes 213 and 214. The sensing lines may be placed on the same layer as the source/drain electrodes 213 and 214 or on the same layer as the light shielding layer 22. If necessary, any one of the signal lines 301 and 302 may be segmented into a plurality of lines placed on different layers, and these line segments may be electrically connected through contact holes penetrating the insulating layer placed between them.

Fourth Exemplary Embodiment

Figure 17:
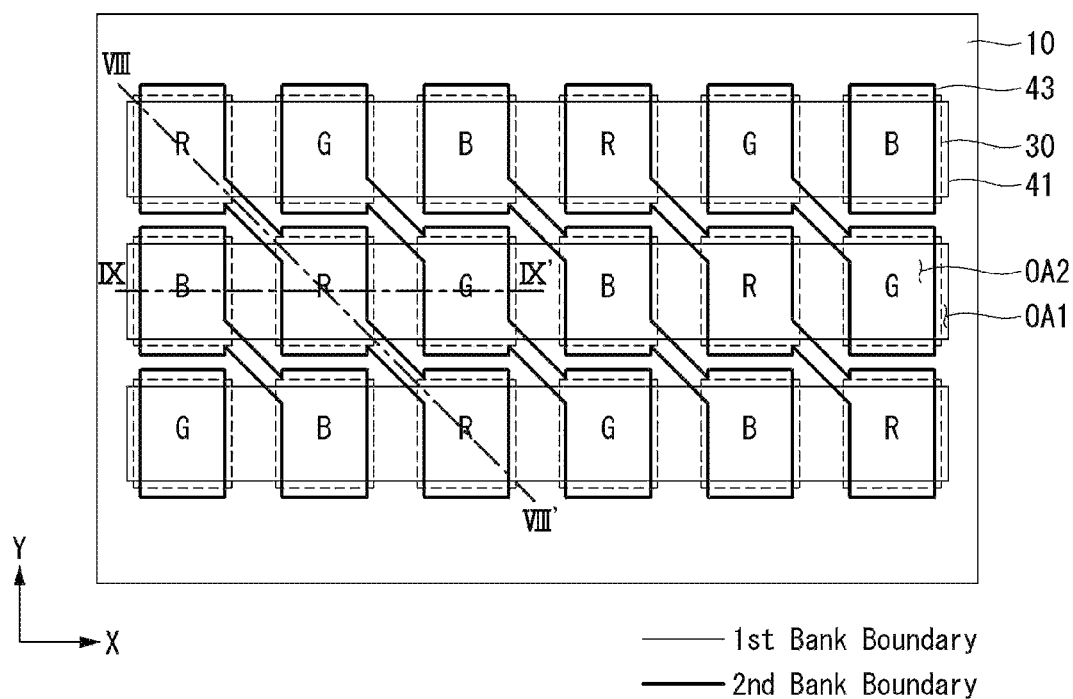
FIG. 17 is a schematic plan view of an organic light-emitting display device according to a fourth exemplary embodiment of the present disclosure.
Figure 18:
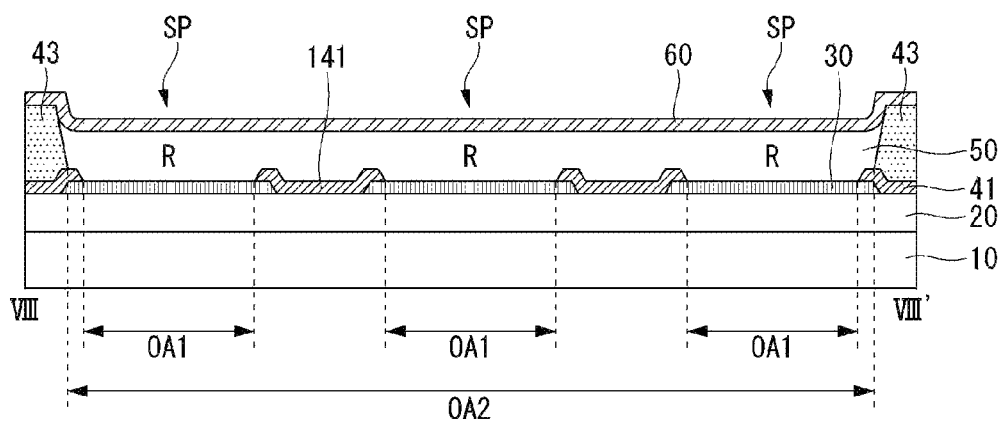
FIG. 18 is a cross-sectional view taken along the line VIII-VIII' in FIG. 17 according to one embodiment of the present disclosure.
Figure 19:
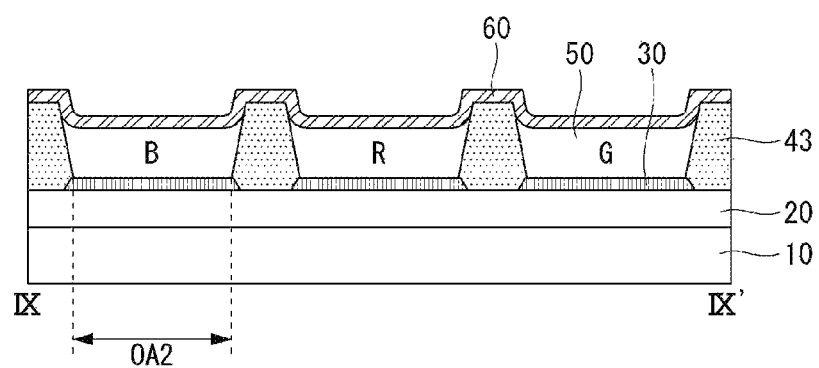
FIG. 19 is a cross-sectional view taken along the line IX-IX' in FIG. 17 according to one embodiment of the present disclosure.

FIG. 17 is a schematic plan view of an organic light-emitting display device according to a fourth exemplary embodiment of the present disclosure. FIG. 18 is a cross-sectional view taken along the line VIII-VIII' in FIG. 17. FIG. 19 is a cross-sectional view taken along the line IX-IX' in FIG. 17.

Referring to FIGS. 17 to 19, the organic light-emitting display device according to the fourth exemplary embodiment comprises a substrate 10 where sub-pixels SP are arranged. The substrate 10 may have various planar shapes, for example, all planar shapes such as square, circular, and elliptical, as well as the rectangular shape shown in the drawings. A first direction (for example, X direction) and a second direction (for example, Y direction), which intersect at a right angle, are defined on the substrate 10, regardless of the planar shape of the substrate 10. The positions and arrangements of sub-pixels and/or openings to be described later may be defined by the first and second axes.

A circuit element layer 20 and organic light-emitting diodes, which are driven by the elements provided in the circuit element layer 20, are placed on the substrate 10.

Signal lines and electrodes for applying driving signals to the organic light-emitting diodes may be arranged on the circuit element layer 20, and the signal lines and the electrodes may be placed separately with at least one insulating layer between them if necessary. If the organic light-emitting display device is an active matrix (AM) display, the circuit element layer 20 may further comprise a transistor allocated per sub-pixel SP.

Each organic light-emitting diode comprises a first electrode 30, a second electrode 60, and an organic light-emitting layer 50 interposed between the first electrode 30 and the second electrode 60. The first electrode 30 may be an anode, and the second electrode 60 may be a cathode.

More specifically, the sub-pixels SP may be arranged along the first direction (e.g., X direction) and second direction (e.g., Y direction) which intersect each other. Two sub-pixels SP arranged neighboring along the first direction may emit light of different colors. Two sub-pixels SP arranged neighboring along the second direction may emit light of different colors. The sub-pixels SP arranged in an oblique direction which are not parallel to the first and second directions may emit light of the same color. In other words, the sub-pixels SP arranged along a third direction which extend at a predetermined angle of tilt with respect to the first and second directions may emit light of the same color. Here, the predetermined angle may be set in a range of $0<\theta<90°$. For convenience of explanation, the direction in which sub-pixels SP emitting light of the same color are arranged will be referred to as the third direction. The first electrodes 30 of the organic light-emitting diodes are placed in the sub-pixels SP. One first electrode 30 may be allocated per sub-pixel SP.

A bank 40 is placed on the first electrodes 30. The bank 40 comprises a first bank 41 and a second bank 43.

The first bank 41 is located on the first electrodes 30. The first bank 41 comprises first openings OA1 exposing at least part of the first electrodes 30. A plurality of first openings OA1 are arranged in parallel in the second direction, and extend in the first direction. The first openings OA1 expose a plurality of first electrodes 30 that extend in the first direction and are arranged along the first direction. Although not shown, a plurality of first openings OA1 may be arranged in parallel in the first direction, and extend in the second direction. In this case, the first openings OA1 expose a plurality of first electrodes 30 that extend in the second direction and are arranged along the second direction. For convenience of explanation, a description will be given below with an example in which a plurality of first openings OA1 are arranged in parallel in the second direction and extend in the first direction.

The first bank 41 may be made relatively thin to be covered by the organic light-emitting layer 50. The first bank 41 may be hydrophilic. In an example, the first bank 41 may be formed of a hydrophilic, inorganic insulating material such as silicon oxide (SiO2) or silicon nitride (SiNx).

Although the drawings illustrate that the first openings OA1 are approximately rectangular, they are not limited to this shape. Also, the drawings illustrate that all of the first openings OA1 have the same shape and area, but they are not limited to this and at least one first opening OA1 may have a different shape and/or area from another first opening OA1. For example, the shape and/or area of the first openings OA1 may be properly selected in view of the lifetime of organic light-emitting materials for forming the organic light-emitting layer 50 of the organic light-emitting diodes. Parts of the first electrodes 30 exposed by the first openings OA1 may be defined as emission regions.

The second bank 43 is placed on the substrate 10 where the first bank 41 is formed. The second bank 43 comprises second openings OA2 exposing at least part of the first electrodes 30. A plurality of second openings OA2 are arranged in parallel in the first or second direction, and extend in the third direction. The second openings OA2 extend in the third direction and expose a plurality of first electrodes 30 arranged along the third direction. Alternatively, the second openings OA2 extend in the third direction and expose a plurality of first openings OA1 arranged along the third direction. Parts of the first electrodes 30 exposed by the first openings OA1 and second openings OA2 may be defined as emission regions. In some regions, the second openings OA2 each may expose only one first electrode 30 or only one first opening OA1.

The second bank 43 may be hydrophobic. In an example, the second bank 43 may be formed with a hydrophobic material coated on an insulating material or formed with an insulating material containing a hydrophobic material. The second bank 43 may be made of organic material. The hydrophobic nature of the second bank 43 may allow the organic light-emitting material constituting the organic light-emitting layer 50 to be coated with a relatively uniform thickness. Also, the second bank 43 may function as a barrier that encloses the organic light-emitting material dropped into a corresponding region, to prevent organic light-emitting materials of different colors from being mixed together.

Although the drawings illustrate that the second openings OA2 are approximately rectangular, they are not limited to this shape. Also, the drawings illustrate that all of the second openings OA2 have the same shape and area, but they are not limited to this and at least one second opening OA2 may have a different shape and/or area from another second opening OA2. For example, the shape and/or area of the second openings OA2 may be properly selected in view of the lifetime of organic light-emitting materials.

The second openings OA2 are located on the outside of the first openings OA1, at a distance from them. That is, the boundary of the first bank 41 is spaced a preset distance apart from the boundary of the second bank 43. Therefore, the first openings OA1 may be exposed by the second openings OA2.

The organic light-emitting layer 50 is placed on the substrate 10 where the second bank 43 is formed. The organic light-emitting layer 50 may be formed within the corresponding second openings OA2, in the direction in which the second openings OA2 extend. That is, the organic light-emitting material deposited into one second opening OA2 covers the first electrodes 30 and first bank 41 exposed by the second opening OA2, and are not physically separated by the first bank 41.

Organic light-emitting material of the same color is deposited on a plurality of first electrodes 30 exposed by one second opening OA2. This means that a plurality of sub-pixels SP allocated to positions corresponding to one second opening OA2 emit light of the same color. The planar shape of the organic light-emitting layer 50 may correspond to the planar shape of the second openings OA2.

Organic light-emitting materials of different colors may be sequentially and alternately deposited in their corresponding second openings OA2. The organic light-emitting materials of different colors may comprise organic light-emitting materials that emit red (R), green (G), and blue (B) light, and if necessary, may further comprise an organic light-emitting material that emits white (W) light.

The second bank 43 is located between the first electrodes 30 neighboring in the first and second directions, so that the organic light-emitting materials of different colors, deposited into the corresponding second openings OA2 neighboring in the first direction, are kept from being mixed together. That is, the organic light-emitting materials of different colors deposited into different second openings OA2 are physically separated by the second bank 43.

The organic light-emitting material used to form the organic light-emitting layer 50 in the solution process is deposited in such a way as to cover at least part of the first electrodes 30, part of the first bank 41, and part of the second bank 43. The first bank 41 is a hydrophilic thin film provided to prevent a wettability problem due to the hydrophobic nature of the first electrode 30, and allows the hydrophilic, organic light-emitting material to spread well. The second bank 43 is a hydrophobic thick film that can prevent the hydrophilic organic light-emitting material from piling up at the edge portion closing to the second bank 43. Therefore, the organic light-emitting material is coated on the first electrodes 30 with a relatively uniform thickness. By the combined structure of the first bank 41 and the second bank 43, the organic light-emitting layer 50 may be made relatively uniform in thickness in the emission regions.

In the organic light-emitting display devices according to the first to third exemplary embodiments, both the first bank 41 and the second bank 43 are located between the pixels neighboring in the first direction. In this case, the boundary of the first bank 41 needs to be spaced a preset distance apart from the boundary of the second bank 43. Therefore, the first bank 41 masks the edges of the first electrodes 30 in the first direction by as much as the preset distance. In this case, the area of the emission regions is reduced by as much as the first electrodes 30 are masked.

Contrariwise, in the organic light-emitting display device according to the fourth exemplary embodiment, the first bank 41 is not located between the pixels neighboring in the first direction. That is, only the second bank 43 may be located between the pixels neighboring in the first direction. Hence, in the fourth exemplary embodiment of the present disclosure, the positional constraints on the first bank 41 become relatively loose compared to the first to third exemplary embodiments, thereby providing wide emission regions on the first electrodes 30. Therefore, the fourth exemplary embodiment of the present disclosure may provide an organic light-emitting display device that ensures a sufficiently large aperture ratio, compared to the first to third exemplary embodiments.

It will be apparent that those skilled in the art can make various modifications and changes thereto within the scope without departing from the technical spirit of the present disclosure through the above descriptions. Therefore, the technical scope of the present disclosure is not limited to the embodiment described above but should be defined by the appended claim

What is claimed is:
1. An organic light-emitting display device comprising:
a substrate where a first direction and a second direction intersecting each other are defined, the substrate on which sub-pixels are arranged along the first direction in a plurality of rows and the second direction in a plurality of columns;
first electrodes of organic light-emitting diodes allocated respectively to the sub-pixels;
a first bank having first openings exposing the first electrodes;
a second bank having a second opening exposing the first electrodes, the second bank on the first bank;
an organic light-emitting layer in the second opening; and
a plurality of transistors, each transistor configured for a corresponding one of the sub-pixels,
wherein a gate electrode of each of the plurality of transistors is electrically connected to the respective first electrode of the organic light-emitting diodes,
wherein in at least one region, the second opening simultaneously exposes at least two first electrodes neighboring in a third direction,
wherein the second opening is in a zigzag shape and simultaneously exposes the first electrodes arranged in the zigzag shape,
wherein the first electrodes arranged in the zigzag shape include a (1-1)th electrode of a first sub-pixel located in a first row from the plurality of rows and a first column from the plurality of columns, a (2-2)th electrode of a second sub-pixel located in a second row from the plurality of rows and a second column from the plurality of columns, and a (3-3)th electrode of a third sub-pixel located in a third row from the plurality of rows and the first column, the second sub-pixel neighboring the first sub-pixel in the third direction,
wherein the second opening includes a first portion exposing the (1-1)th electrode, a second portion exposing the (2-2)th electrode, a third portion exposing the (3-3)th electrode, and a connecting portion connecting the first portion and the second portion, wherein the organic light-emitting layer continuously extends in the third direction such that the organic light-emitting layer is in the first portion of the second opening that exposes the (1-1)th electrode of the first sub-pixel, the second portion of the second opening that exposes the (2-2)th electrode of the second sub-pixel, and the connecting portion that connects the first portion and the second portion, wherein a width of the connecting portion is smaller than a width of the first portion or the second portion, and wherein the width of the connecting portion is a distance between the second bank disposed at one side of the connecting portion and the second bank disposed at another side of the connecting portion.

2. The organic light-emitting display device of claim 1, wherein the connecting portion extends in the third direction.

3. The organic light-emitting display device of claim 1, wherein the first portion and the second portion are tilted at a preset angle.

4. The organic light-emitting display device of claim 3, wherein the preset angle is in a range from 0 to 90°.

5. The organic light-emitting display device of claim 1, wherein the first portion is symmetrical with respect to a first virtual line that runs across a center of the first portion, and the second portion is symmetrical with respect to a second virtual line that runs across a center of the second portion, wherein the first virtual line and the second virtual line are parallel to each other and tilted at a preset angle with respect to the first direction.

6. The organic light-emitting display device of claim 1, wherein the second bank is located between the first electrodes neighboring in the first direction and between the first electrodes neighboring in the second direction.

7. The organic light-emitting display device of claim 1, wherein, in at least one region, one second opening exposes one first electrode.

8. The organic light-emitting display device of claim 1, wherein the first openings each expose one first electrode.

9. The organic light-emitting display device of claim 1, wherein the first openings expose a plurality of first electrodes arranged along the first direction or second direction.

10. The organic light-emitting display device of claim 1, wherein the first bank is hydrophilic, and the second bank is hydrophobic.

11. The organic light-emitting display device of claim 1, wherein an angle between the third direction and the first direction and an angle between the third direction and the second direction are a tilted angle.

12. The organic light-emitting display device of claim 1, wherein a second electrode of the organic light-emitting diodes has a bend portion at an edge of each of the sub-pixels.

13. The organic light-emitting display device of claim 1, wherein the second sub-pixel also neighbors the third sub-pixel in the third direction.

14. The organic light-emitting display device of claim 1, wherein each of the second openings further includes another connecting portion that connects the second portion and the third portion.

* * * * *